Figure 1:
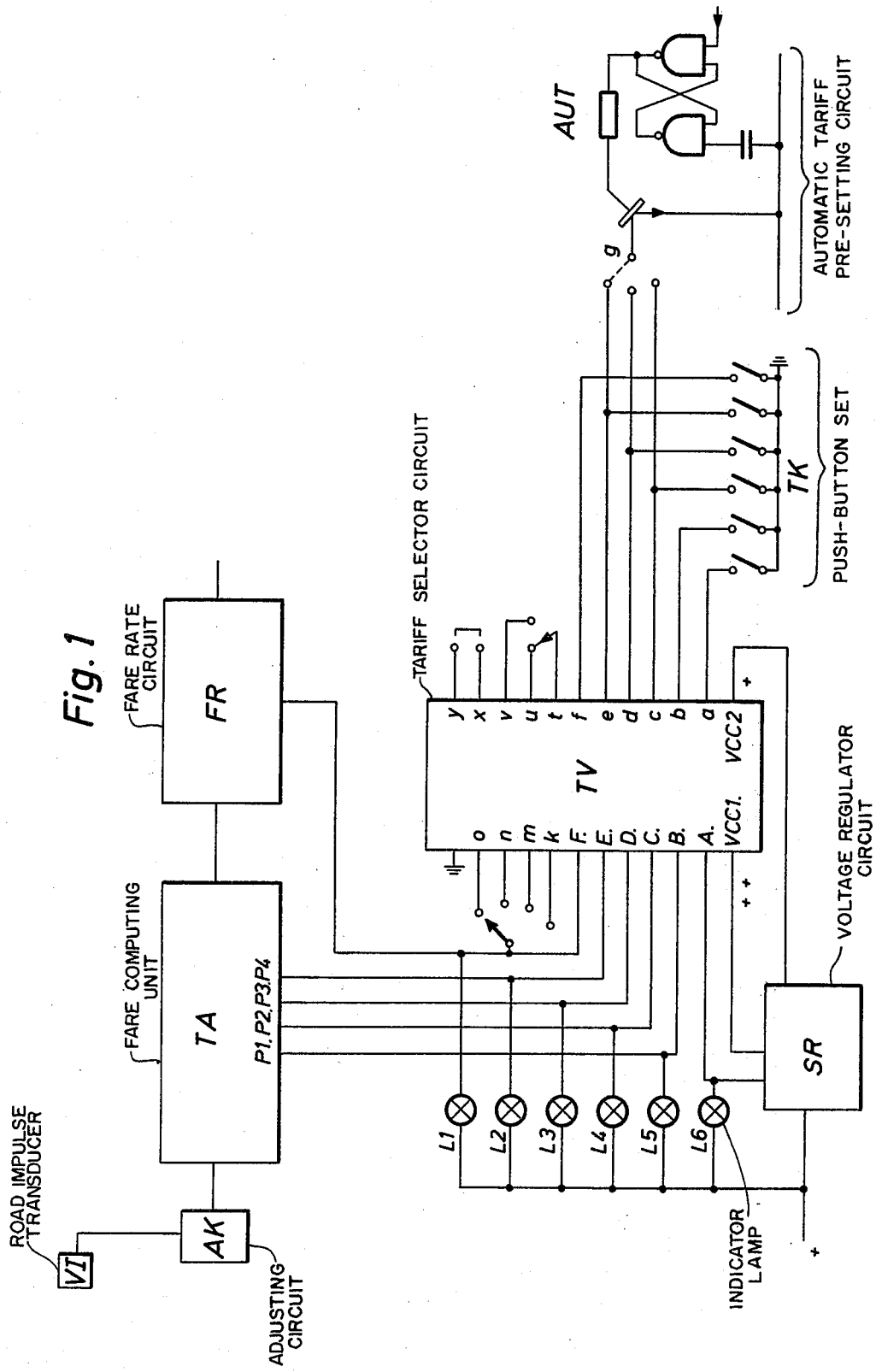

United States Patent [19]

Larsen

[11] 4,001,560
[45] Jan. 4, 1977

[54] APPARATUS FOR OPERATION SELECTOR CIRCUITS, ESPECIALLY TARIFF SELECTOR CIRCUITS IN ELECTRONICALLY OPERATED TAXIMETERS

[75] Inventor: Carl Ib Peder Larsen, Slagelse, Denmark

[73] Assignee: Haldex Aktiebolag, Sweden

[22] Filed: May 29, 1974

[21] Appl. No.: 474,212

[30] Foreign Application Priority Data

May 30, 1973  Sweden .............................. 7307691

[52] U.S. Cl. ........................ 235/151.32; 235/30 R; 235/45

[51] Int. Cl.² ...................................... G07B 13/10

[58] Field of Search .............. 235/151.32, 30 R, 44, 235/45, 47, 92 MT, 92 PD, 92 DN, 92 TC, 168; 307/115; 340/172.5

[56] References Cited

UNITED STATES PATENTS

| | | | |
|---|---|---|---|
| 3,512,706 | 5/1970 | Sanders | 235/30 |
| 3,818,186 | 6/1974 | Harwood | 235/45 X |
| 3,843,874 | 10/1974 | Kelch | 235/150.2 |
| 3,860,807 | 1/1975 | Fichter et al. | 235/168 |

Primary Examiner—Edward J. Wise
Attorney, Agent, or Firm—Robert E. Burns; Emmanuel J. Lobato; Bruce L. Adams

[57] ABSTRACT

An electronic taximeter having a fare computing unit, a selector circuit and an operation switching unit. The fare computing unit computes a fare at a rate determined by logic signals developed by the selector circuit, which is responsive to signals applied thereto. The operation switching unit is operable to develop selected operating signals to determine the logic signals developed by the selector circuit. The selector circuit remains in an operating state determined by the last operating signal applied thereto, even after the last operating signal is removed, until a new operating signal is applied to change the logic signal output of the selector circuit.

6 Claims, 2 Drawing Figures

APPARATUS FOR OPERATION SELECTOR CIRCUITS, ESPECIALLY TARIFF SELECTOR CIRCUITS IN ELECTRONICALLY OPERATED TAXIMETERS

The present invention relates to switching and blocking function means, especially tariff selector circuits, and is intended to provide improved circuits of this kind intended primarily for logical switching and blocking functions in electronic taximeters, in connection with the use of the taximeters for fare computing in response to journey length and registration of current tariff, number of kilometers driven etc.

The problem of providing necessary logical functions in a tariff selector circuit of the present type, such as: Tariff-Fare-Free, or alternatively Tariff-Fare-(possibly tariff) Fare-Free, and ensuring that improper functions are unable to be effected is very difficult to solve. Several tariff selector circuits have been proposed, but all of them have been found to have one or more of the following deficiencies: Uncertain contact functions, multiple contact functions of the type "contact rebound", ambigous function cycles caused for example by push-button operation, whereat more than one button can unintentionally be pressed, with logically incorrect sequences as the result.

The present invention seeks to provide improved tariff selector circuits, suitable for use in electronic taximeters, which provide switching and blocking functions with the help of contact connections wherein the effect of contact rebound is eliminated without using complicated or expensive mechanical switching means, which can be used with taximeters having automatic tariff adjustment cycles, and which also preclude more than one switching function being in action simultaneously, independent of how many contact connections are intentionally or unintentionally made at the same time, or which preclude switching functions with incorrect sequences coming into operation.

The features especially distinguishing the present invention are apparent in the following patent claims.

The invention will now be more closely explained while referring to the accompanying drawings, which show an embodiment of the invention in a simplified and diagrammatic form.

FIG. 1 shows a general block diagram and

Figure 2:
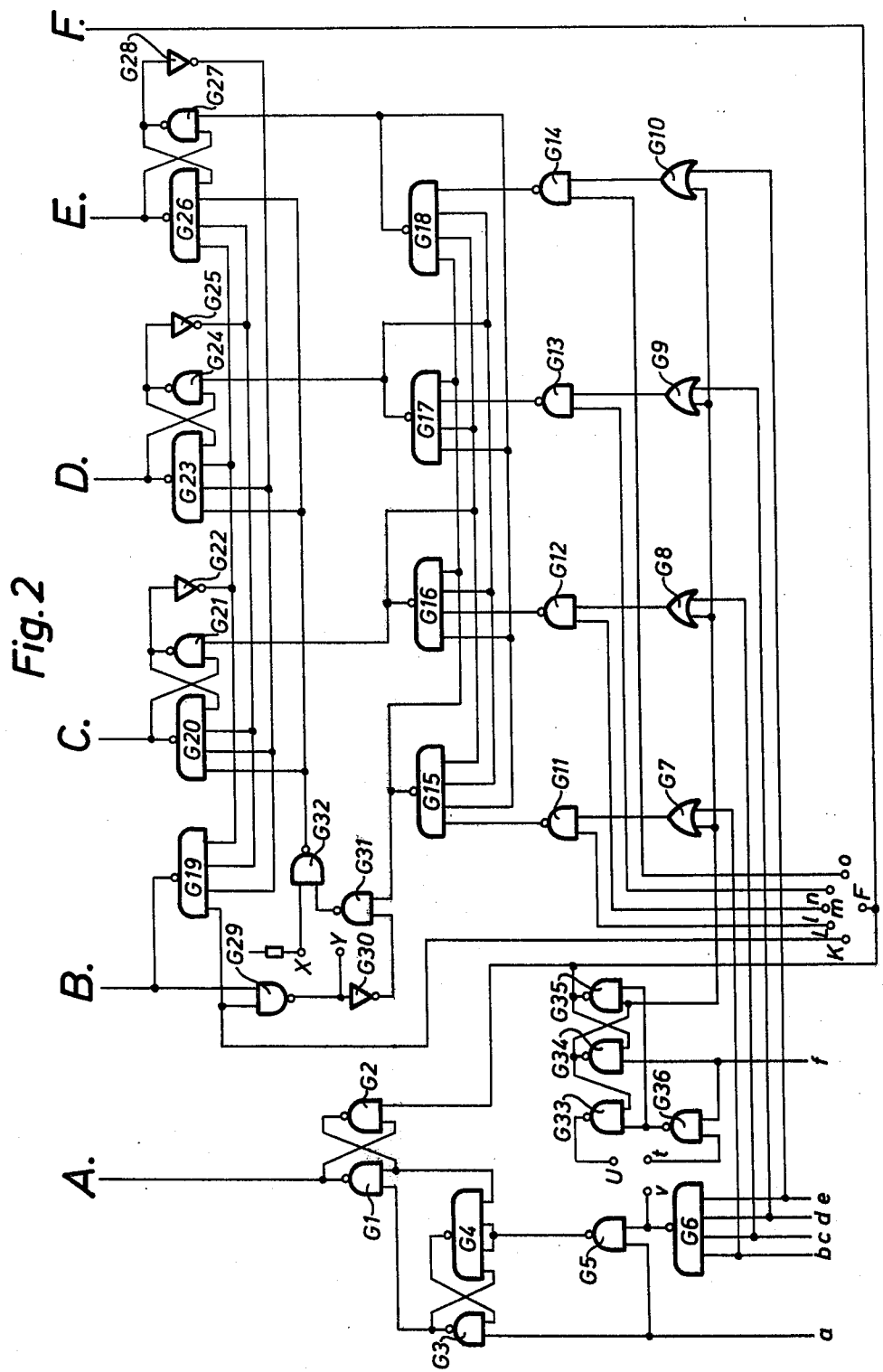

FIG. 2 a more detailed diagram of a portion of FIG. 1.

It may be seen from FIG. 1 how a tariff selector circuit TV is arranged in an electronic taximeter system of the kind embraced by the invention. Road impulses obtained from a road impulse transducer V1 are fed by a special adjusting circuit AK to an electronically controlled fare computing unit TA. A suitable road impulse transducer is disclosed in U.S. Pat. No. 3,512,706. The fare adjusting circuit AK and the fare computing unit TA are both disclosed in U.S. Pat. No. 3,867,617. Information for controlling the computing unit is taken from said tariff selector circuit TV over four operation lines P1-P4 for logical levels, in the present example, the information state being indicated by a number of indicator means such as lamps L2-L5. The function of tariff selector circuit TV is in its turn controlled by a number of operation current switches arranged in the form of a push-button set TK. On being pushed, the contacts in the button set switch the inputs $a$-$b$-$c$-$d$-$e$-$f$ to earth, signifying the logical level "0". It is also apparent from FIG. 1 that the current supply of the taximeter system is operated over a voltage regulator circuit SR via an output A with associated indicator lamp 16. The voltage regulator circuit SR is not essential and may be omitted. The Fairchild $\mu$A 723 is a suitable commercially available circuit if one is to be included. Certain circuits which have the task of controlling switching-in and switching-out of the tariff selector circuit, and computing the total number of kilometers driven are not dealt with. The tariff selector circuit outputs B-C-D-E are also connected to said operation lines P1-P2-P3-P4 on the fare computing circuit TA.

A special output F with associated indicating lamp L1 registers the state of the taximeter in an operational condition called "Fare". The inputs $k$-$m$-$n$-$o$ on the tariff selector circuit TV may be individually connected to the output F and determine whether a road tariff is connected or not in the condition "Fare". The output F of the fare computing circuit TA is also applied to the fare rate circuit FR which is disclosed in U.S. Pat. No. 3,718,811.

There are further three inputs $t$-$u$-$v$ on the tariff selector circuit, so arranged that alternative couplings can be made, whereat if $t$ is connected with $u$ it is impossible to shift from said position "Fare" condition to a certain tariff, but if instead $t$ is connected with $v$ this operation sequence is possible. The two inputs $x$-$y$ on the tariff selector circuit can be connected with each other, an electronic blockage being thereby arranged in the circuit, which prevents a return from a certain tariff B to one of the other tariffs designated C-D-E. Said tariff B can however be chosen if it is the first one chosen when using the taximeter after switching on.

In the present example of an electronic taximeter system it is possible to use automatic tariff re-setting, a certain one of the inputs $c$-$d$-$e$ of the tariff selector circuit being connected to earth by a flipflop. This takes place either at a definite journey distance or when a predetermined sum has occured switching to low level "0" taking place in response to an impulse fed to the input of the flipflop. The taximeter is hereby fixed to the tariff, which corresponds to the one obtained when a predetermined input of inputs $c$-$d$-$e$ is connected via the switch $g$ to said flipflop.

The function of the tariff selector circuit TV itself will now be described in the following while referring to FIG. 2 of the drawing.

As may be seen from the Figure, the tariff selector comprises a number of gates G1-G36. The gates G1-G6 are provided with a continuous supply voltage when the taximeter is in use. On the other hand, current supply to the remaining gates G7-G36 is determined by the logical level of output A on gate G1, which controls the voltage regulator SR for this purpose via said output. When the output level reaches the logical "1", voltage is applied to gates G7-G36 and is removed when the output level assumes the logical "0".

The gates G3 and G4 are coupled as a flipflop with the function of determining whether the taximeter shall be in the tariff position or in the free position. When the input of G3 is connected to earth, i.e. "0", its output is at "1", this level being applied to the one input of the gate G1. If G1's second input is also initially at "1", G1's input A will have the logical level "0", whereby current supply according to the above to gates G7-G36 is interrupted.

If any one of the inputs b-c-d-e is now earthed, the output on gate G6, which in its turn is coupled to the one input of G5, will be at "1", and if the second input of G5 is initially at "1", the output of G5 will assume a logical "0". Gate G4 will develope "1" on its output, and the output of G3 feeds "0" and further G1's output "1", the current supply to gates G7-G36 thereby being coupled in.

As the gates G1,G2 are coupled as a flipflop, the logical state now obtained remains right up until G2 obtains a logic "0" on its second input. This can only happen after input $f$ on another flipflop, namely G34,G35 has been switched to logical "0".

The four inputs on gate G6, b-c-d-e are further connected individually with one input of a corresponding one of four OR gates G7,G8,G9 and G10. The second input of each of these OR gates is commonly connected with the output of said flipflop G34,G35. Since the input on G34 in its primary condition is at logical "1", the output is "0". This means that logical signals which are applied to the gates G7,G8,G9 and G10 switch the output levels of said gates. If for example all of them have "1" at their inputs, then their outputs will be at "1". The outputs of the OR gates G7-G10 in their turn are connected to the respective gates G11,G12,G13 and G14. The gates G7 through G14 jointly comprise logic circuit means which are responsive to the operating signals developed by setting push-button set TK for developing logic signals corresponding to different ones of the operating signals. In the initial condition these gates have a logical "1" applied to their second inputs, for which reason their outputs connected with the gates G15,G16,G17 and G18 will have the level "0", which further signifies that the outputs on the last mentioned gates will be at the "1" level. The situation to now be described arises after one of the inputs b-c-d-e has been put at the "0" level. The outputs B-C-D-E from the tariff selector circuit can assume five possible logical combinations, which are accomplished by a gate system connected together and consisting of gates G19-G32. The system can be considered as an impulse controlled switch, whereat said combinations can either be "1" on all four outputs or "0" on any one of the outputs B-C-D-E. Determinative for this is which of the four inputs on the gates G31,G21,G24 and G27 has last been at "0". The gates G20,G21,G22,G23,G24,G25 and G26,G27,G28 are coupled as flipflops, each with one plus three inputs. If the output on gate G20 initially is at "0", "1" is obtained on the output of gate G21,G22, thereby having a "0", while G23 and G26 have "1" on their outputs. When the inputs on G21,G24 and G27 similarly have "1", obtained from the outputs on gates G16,G17 and G18, the outputs on G24 and G27 will be at "0" while G25 and G28 will be at "1" respectively, which means that level "0" is locked on the output of gate G20. The gates G15-G28 jointly comprise output circuit means receptive of the logic signals for developing the logic signals as tariff selector circuit input signals.

Since the outputs on gates G22,G25 and G28 are coupled in their turn to the inputs on G19, the output of this will assume "1", because the input which is connected to G22 has "0". This causes in its turn the output on G29 to assume "0" and G30 to assume "1", furthermore gate G31 develops "0" and G32 develops "1" on their outputs, which does not alter the logical condition of G20's output. This condition has arisen as the result of input c being lowered to the "0" level, and that the output on G8, which is connected to the one input on G12 has also assumed the "0" level. The output on said gate G12 assumes "1" as a result of this, which in its turn is applied to one of the inputs on gate G16. The other inputs on G16 which are also connected to the outputs on G15,G17 and G18 similarly have the level "1", causing the output on G18 to assume "0", and the supply of logical levels to G15,G16 and G17 is blocked by one of the four inputs on each of said gates having an "0", thereby precluding a shift to "1" on their outputs. At the same time G21 has a "1" on its output, while G22 has "0", which in its turn means the outputs on gates G19,G23 and G26 must assume the "1" level. The condition thus obtained is locked and cannot re-set even if c is re-set to level "1". On the other hand, this condition causes the inputs on G7,G8,G9 and G10 to be open, i.e. sensitive to alterations of the input level. If now the input $b$ is put to "0", the previously described cycle is repeated with the difference that the output on gate G17 coupled to the input on G24 assumes "0". The output on G24 shifts to "1" which in its turn gives the level "0" on the output of G25, G20's output level shifts to "1" and a new stable condition is arrived at. If input $f$ is also put at the "0" level, and the input on G36 is initially coupled to the output on G33 via t-u according to FIG. 1, the outputs of G34 and G36 will shift levels to "1", which in its turn results in the outputs on G33 and G35 shifting to "0". This condition is also locked, irrespective of whether $f$ is re-set to "1". When now the output on G34 is at "1", and as it is coupled to the gates G7,G8,G9 and G10, these are blocked against altered logical levels on the input lines b-c-d-e. If instead the input on gate G36 had been connected with the output on G6 via t-v, this blockage would have been lifted. The output level in the previously mentioned condition is "0" on the gate G35, whereby a switch connected to this output makes it possible to apply this level to the inputs k-l-m-n-o and determine a certain logical level on the outputs B-C-D-E in their turn according to the following table:

Switch position
k; "1" on all outputs
l; "0" at B
m; "0" at C
n; "0" at D
o; "0" at E If one further connects output $x$ on G29 with the input $y$ on G32, only "0" can be obtained on line B unless input $b$ is the one which was first connected to "0" after input $a$ is first connected to "0". When finally the output on G19 assumes the level "1", the output on G29, which now is in connection with the input on G22, will assume "0", thereby blocking level alterations on the output of gate G15. Thus, the tariff selector circuit is programmable to respond to only certain operating signals, and may be reset to respond to all of them.

The above description constitutes only one embodiment example of an electronic taximeter system according to the invention. The possibilities available with apparatus utilizing the invention should be especially pointed out. These are for example the possibility of placing the operating means itself - the button set - separate from the taximeter unit, the provision of operating means connected in parallel, automatic tariff re-setting circuits, and program controlling means and indicators either directly on the taximeter or separated from it by operating cables.

The invention is naturally not limited to use in connection with taximeters, but can also be utilized in installations where it is necessary to lock the operating functions.

What is claimed is:

1. In an electronic taximeter of the type having a fare computing unit for computing a fare at a rate determined by logic signals applied thereto; a tariff selector circuit responsive to operating signals for developing and applying fare determining logic signals to said fare computing unit; and an operation switching unit operable to apply selected operating signals to said selector circuit for selectively developing fare determining logic signals; wherein said selector circuit comprises:

logic circuit means responsive to said operating signals for developing logic signals corresponding to different ones of said operating signals applied thereto; and output circuit means receptive of said logic signals for developing said logic signals as tariff selector circuit output signals for controlling the fare computing unit, said output circuit means being responsive to a received logic signal for maintaining a stable condition while developing the received logic signal as an output signal and thereafter maintaining the output signal even in the absence of the received logic signal; and during intermittent application of the received signal, and developing a different output signal only upon receiving a different logic signal.

2. In an electronic taximeter according to claim 1, wherein said tariff selector circuit is programmable to render said tariff selector circuit responsive to only certain operating signals.

3. In an electronic taximeter according to claim 2, wherein said programmable tariff selector circuit comprises means for resetting said programmable tariff selector circuit to respond to all of said operating signals.

4. In an electronic taximeter according to claim 1, further comprising indicator means receptive of said logic signals for indicating which of said logic signals are applied to said fare computing unit.

5. In an electronic taximeter according to claim 1, wherein said selector circuit includes a flip-flop responsive to one of said operating signals, and a voltage regulator circuit enabled by said flip-flop for energizing said logic means when said flip-flop responds to said one of said operating signals.

6. In an electronic taximeter according to claim 1, wherein said logic circuit means comprises: a plurality of OR gates each having a first input for receiving a respective one of said operating signals and a second input connected in common with the second inputs of the other OR gates; and a plurality of NAND gates each having an input connected to the output of a corresponding one of said OR gates.

* * * * *